US012804791B2

(12) United States Patent
Ueda

(10) Patent No.: US 12,804,791 B2

(45) Date of Patent: Nov. 17, 2026

(54) CHAMBER, EXTREME ULTRAVIOLET LIGHT GENERATION SYSTEM, AND ELECTRONIC DEVICE MANUFACTURING METHOD

(71) Applicant: Gigaphoton Inc., Tochigi (JP)

(72) Inventor: Atsushi Ueda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 134 days.

(21) Appl. No.: 18/825,486

(22) Filed: Sep. 5, 2024

(65) Prior Publication Data

US 2025/0126699 A1 Apr. 17, 2025

(30) Foreign Application Priority Data

Oct. 12, 2023 (JP) ................................ 2023-177127

(51) Int. Cl.

| | |
|---|---|
| ***G03F 7/20*** | (2006.01) |
| ***G02B 5/08*** | (2006.01) |
| ***G03F 1/22*** | (2012.01) |
| ***G03F 7/00*** | (2006.01) |
| ***H05G 2/00*** | (2006.01) |

(52) U.S. Cl.

CPC ............. *H05G 2/0094* (2024.08); *G03F 1/22* (2013.01); *G03F 7/70033* (2013.01); *G03F 7/702* (2013.01); *G03F 7/70233* (2013.01); *G03F 7/70933* (2013.01); *G03F 7/70983* (2013.01); *H05G 2/0082* (2024.08)

(58) Field of Classification Search

CPC .... H05G 2/0094; H05G 2/0082; H05G 2/008; H05G 2/0092; H05G 2/003; G03F 1/22; G03F 7/70033; G03F 7/702; G03F 7/70233; G03F 7/70933; G03F 7/70983; G03F 7/70925; G03F 7/70916; G03F 7/70175; B08B 7/0071

See application file for complete search history.

(56) References Cited

U.S. PATENT DOCUMENTS 6,891,172 B2 5/2005 Ohgushi et al.
11,350,514 B2 5/2022 Koge et al.
11,366,394 B2 6/2022 Koge et al.
2017/0238407 A1* 8/2017 Nagai ................ G03F 7/70175 250/504 R
2020/0312479 A1* 10/2020 Ueda ...................... H05G 2/009

* cited by examiner

*Primary Examiner* — Mesfin T Asfaw

(74) *Attorney, Agent, or Firm* — Studebaker Brackett PLLC

(57) ABSTRACT

A chamber to generate extreme ultraviolet light includes a gas supply port through which gas is supplied into the chamber; a light concentrating mirror concentrating the extreme ultraviolet light; a first exhaust pipe arranged in the chamber, surrounding a plasma generation region, and including a first opening through which the gas supplied into the chamber is sucked and through which the extreme ultraviolet light is radiated toward the light concentrating mirror, and a first exhaust port through which the gas sucked through the first opening is exhausted to an outside of the chamber; and a second exhaust pipe arranged in the chamber, and including a second opening which is located in a periphery of the first opening and through which the gas supplied into the chamber is sucked, and a second exhaust port through which the gas sucked through the second opening is exhausted to the outside of the chamber.

19 Claims, 16 Drawing Sheets

CHAMBER, EXTREME ULTRAVIOLET LIGHT GENERATION SYSTEM, AND ELECTRONIC DEVICE MANUFACTURING METHOD

CROSS-REFERENCE TO RELATED APPLICATIONS

The present application claims the benefit of Japanese Patent Application No. 2023-177127, filed on Oct. 12, 2023, the entire contents of which are hereby incorporated by reference.

BACKGROUND

1. Technical Field

The present disclosure relates to a chamber, an extreme ultraviolet light generation system, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: U.S. Pat. No. 11,366,394
Patent Document 2: U.S. Pat. No. 11,350,514
Patent Document 3: U.S. Pat. No. 6,891,172

SUMMARY

A chamber, according to an aspect of the present disclosure in which a target is turned into plasma to generate extreme ultraviolet light at a plasma generation region by the target being irradiated with laser light, includes a gas supply port through which a gas is supplied into the chamber; a light concentrating mirror configured to concentrate the extreme ultraviolet light; a first exhaust pipe arranged in the chamber, surrounding the plasma generation region, and including a first opening through which the gas supplied into the chamber is sucked and through which the extreme ultraviolet light is radiated toward the light concentrating mirror, and a first exhaust port through which the gas sucked through the first opening is exhausted to an outside of the chamber; and a second exhaust pipe arranged in the chamber, and including a second opening which is located in a periphery of the first opening and through which the gas supplied into the chamber is sucked, and a second exhaust port through which the gas sucked through the second opening is exhausted to the outside of the chamber.

An extreme ultraviolet light generation system according to another aspect of the present disclosure includes a chamber in which a target is turned into plasma to generate extreme ultraviolet light at a plasma generation region by the target being irradiated with laser light, the chamber including a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber; a target supply unit configured to generate a droplet being the target and supply the droplet to the plasma generation region; a laser light generation unit configured to generate the laser light; and an exhaust device configured to exhaust the gas through the first exhaust port and the second exhaust port.

An electronic device manufacturing method according to another aspect of the present disclosure includes generating extreme ultraviolet light using an extreme ultraviolet light generation system, outputting the extreme ultraviolet light to an exposure apparatus, and exposing a photosensitive substrate to the extreme ultraviolet light in the exposure apparatus to manufacture an electronic device. Here, the extreme ultraviolet light generation system includes a chamber in which a target is turned into plasma to generate the extreme ultraviolet light at a plasma generation region by the target being irradiated with laser light. The chamber includes a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber. The extreme ultraviolet light generation system further includes a target supply unit configured to supply a droplet being the target to the plasma generation region, a laser light generation unit configured to generate the laser light, and an exhaust device configured to exhaust the gas through the first exhaust port and the second exhaust port.

An electronic device manufacturing method according to another aspect of the present disclosure includes inspecting a defect of a mask by irradiating the mask with extreme ultraviolet light generated by an extreme ultraviolet light generation system, selecting a mask using a result of the inspection, and exposing and transferring a pattern formed on the selected mask onto a photosensitive substrate. Here, the extreme ultraviolet light generation system includes a chamber in which a target is turned into plasma to generate the extreme ultraviolet light at a plasma generation region by the target being irradiated with laser light. The chamber includes a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber. The extreme ultraviolet light generation system further includes a target supply unit configured to supply a droplet being the target to the plasma generation region, a laser light generation unit configured to generate the laser light, and an exhaust device configured to exhaust the gas through the first exhaust port and the second exhaust port.

BRIEF DESCRIPTION OF THE DRAWINGS

Embodiments of the present disclosure will be described below merely as examples with reference to the accompanying drawings.

DESCRIPTION OF EMBODIMENTS

Contents

Figure 1:
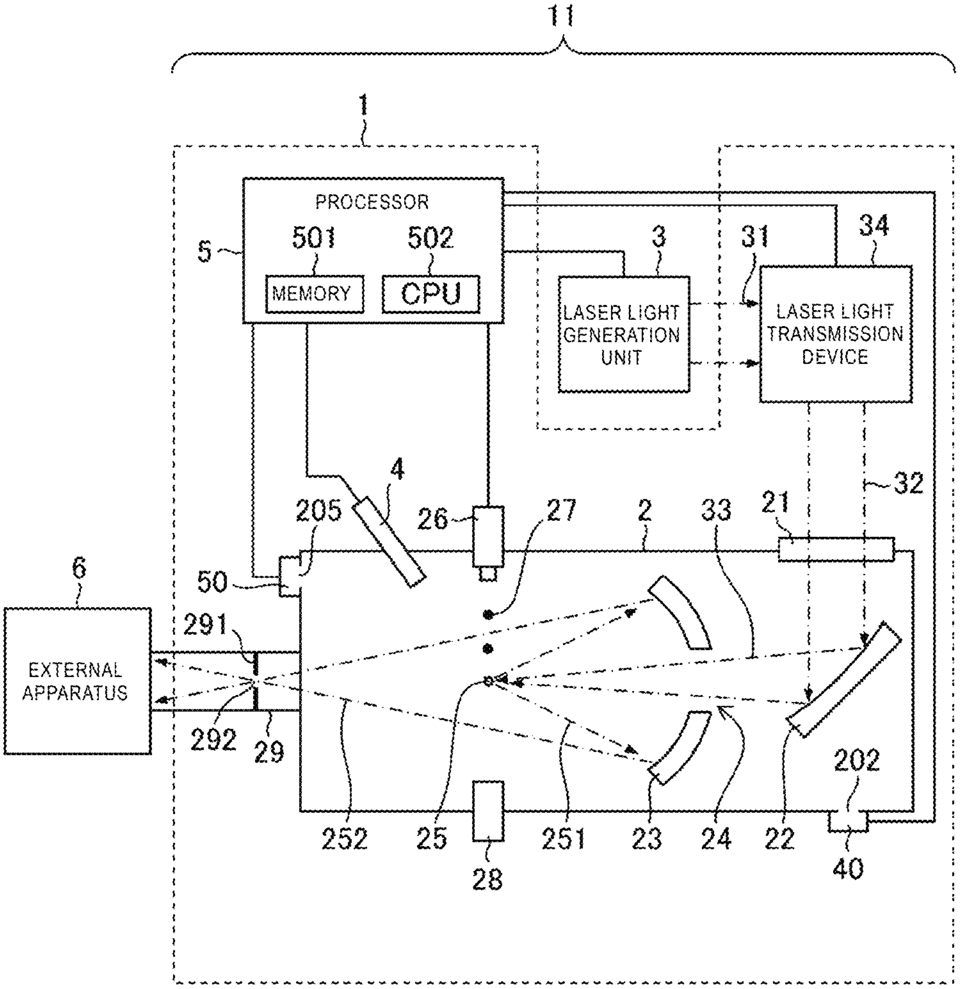
FIG. 1 is a diagram schematically showing an exemplary configuration of an LPP EUV light generation system.

1. Description of terms
2. Overall description of EUV light generation system
   - 2.1 Configuration
   - 2.2 Operation
3. Description of EUV light generation apparatus including chamber according to comparative example
   - 3.1 Configuration
   - 3.2 Operation
   - 3.3 Problem
4. First embodiment
   - 4.1 Configuration
   - 4.2 Operation
   - 4.3 Effect
5. Second embodiment
   - 5.1 Configuration
   - 5.2 Operation
   - 5.3 Effect
6. Third embodiment
   - 6.1 Configuration
   - 6.2 Operation
   - 6.3 Effect
   - 6.4 First modification of third embodiment
     - 6.4.1 Configuration
     - 6.4.2 Operation
     - 6.4.3 Effect
   - 6.5 Second modification of third embodiment
     - 6.5.1 Configuration
     - 6.5.2 Operation
     - 6.5.3 Effect
7. Arrangement position of opening of second exhaust pipe
8. Electronic device manufacturing method
9. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Description of Terms

A "gas flow rate" is a mass flow rate of a gas. The mass flow rate is a mass of the gas passing through a unit area in unit time. Here, "nlm" is used for a unit of the flow rate and represents the volume of the gas flowing per minute at 0° C. and 1 atm.

A "target" is an object to be irradiated with laser light introduced into a chamber. The target irradiated with laser light is turned into plasma and emits EUV light.

A "droplet" is a form of a target supplied into a chamber and is also referred to as a "droplet target." A path along which the droplet travels is called a "droplet trajectory." The droplet trajectory may be referred to as a DL trajectory.

A "plasma generation region" is a predetermined region in the chamber. The plasma generation region is a region in which a target output into the chamber is irradiated with the laser light and in which the target is turned into plasma. The expression "EUV light" is an abbreviation for "extreme ultraviolet light."

2. Overall Description of EUV Light Generation System

2.1 Configuration

FIG. 1 is a diagram schematically showing an exemplary configuration of an LPP EUV light generation system 11. An EUV light generation apparatus 1 is used together with a laser light generation unit 3. In the present disclosure, a system including an EUV light generation apparatus 1 and the laser light generation unit 3 is referred to as the EUV light generation system 11. The laser light generation unit 3 may be configured using, for example, a carbon dioxide laser system. The laser light generation unit 3 may be a laser system in which a YAG laser and a carbon dioxide laser are combined.

The EUV light generation apparatus 1 includes a chamber 2 and a target supply unit 26. The chamber 2 is a sealable container. The target supply unit 26 generates a droplet of a target substance and supplies the droplet into the chamber 2 as the target 27. The material of the target substance includes, for example, tin. The target supply unit 26 includes a tank storing the target substance, a heater heating the tank to melt the target substance, a nozzle having a hole through which the molten target substance is output, a piezoelectric element vibrating the nozzle, and a pressure regulator adjusting the pressure of the tank. The target supply unit 26 is also referred to as a droplet generator.

The wall of the chamber 2 is provided with a through hole for guiding pulse laser light 32 into the chamber 2. The through hole is closed by a window 21, and the pulse laser light 32 passes through the window 21. An EUV light concentrating mirror 23 having a spheroidal reflection surface is arranged in the chamber 2.

The EUV light concentrating mirror 23 has a first focal point and a second focal point. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The chamber 2 includes a gas supply port 202 for introducing a hydrogen gas and a gas exhaust port 205 for exhausting the hydrogen gas. The gas supply port 202 is connected to a gas supply device 40 that supplies the hydrogen gas. The gas exhaust port 205 is connected to an exhaust device 50 that exhausts the hydrogen gas. The exhaust device 50 includes a pump (not shown).

Further, the EUV light generation apparatus 1 includes a processor 5, a target sensor 4, and the like. The processor 5 is a processing device including a memory 501 in which a control program is stored, and a central processing unit (CPU) 502 which executes the control program. The processor 5 is specifically configured or programmed to perform various processes. The target sensor 4 detects at least one of the presence, trajectory, position, and velocity of the target 27. The target sensor 4 may have an imaging function.

Further, the EUV light generation apparatus 1 includes a connection portion 29 providing communication between the inside of the chamber 2 and the inside of an external apparatus 6. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element. The laser light concentrating mirror 22 is arranged to reflect the pulse laser light 32 and concentrate the reflected pulse laser light 33 on the plasma generation region 25.

2.2 Operation

The operation of the EUV light generation system 11 will be described. The pulse laser light 31 output from the laser light generation unit 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as pulse laser light 33.

The target supply unit 26 supplies the target 27 containing the target substance to the plasma generation region 25 in the chamber 2. The target 27 is irradiated with the pulse laser light 33. The target 27 irradiated with the pulse laser light 33 is turned into plasma, and radiation light 251 is radiated from the plasma. EUV light contained in the radiation light 251 is reflected by the EUV light concentrating mirror 23 with higher reflectance than light in other wavelength ranges. Reflection light 252 including the EUV light reflected by the EUV light concentrating mirror 23 is concentrated on the intermediate focal point 292 and output to the external apparatus 6. Here, one target 27 may be irradiated with a plurality of pulses included in the pulse laser light 33. The external apparatus 6 may be, for example, an exposure apparatus or an inspection apparatus.

When the target 27 is turned into plasma, fine particles and charged particles f tin (hereinafter, referred to as "tin debris") are generated, and some of them adhere to the surfaces of the EUV light concentrating mirror 23 and other components. While the EUV light generation system 11 is in operation, the gas supply device 40 continues to supply the hydrogen gas to the chamber 2, and the exhaust device 50 continues to exhaust, from the chamber 2, the gas in the chamber 2. The radicals or ions generated from the hydrogen gas react with the tin configuring the tin debris and a stannane ($SnH_4$) gas is generated. In this course, the tin adhered to the EUV light concentrating mirror 23 and other components is removed. The stannane gas and the unreacted hydrogen gas are exhausted to the outside of the chamber 2 by the exhaust device 50.

The processor 5 controls the entire EUV light generation system 11. Based on the detection result of the target sensor 4, the processor 5 controls timing at which the target 27 is output, an output direction of the target 27, and the like. Further, the processor 5 controls oscillation timing of the laser light generation unit 3, a travel direction of the pulse laser light 32, the concentration position of the pulse laser light 33, the gas supply device 40, the exhaust device 50, and the like.

3. Description of EUV Light Generation Apparatus Including Chamber According to Comparative Example

3.1 Configuration

Figure 2:
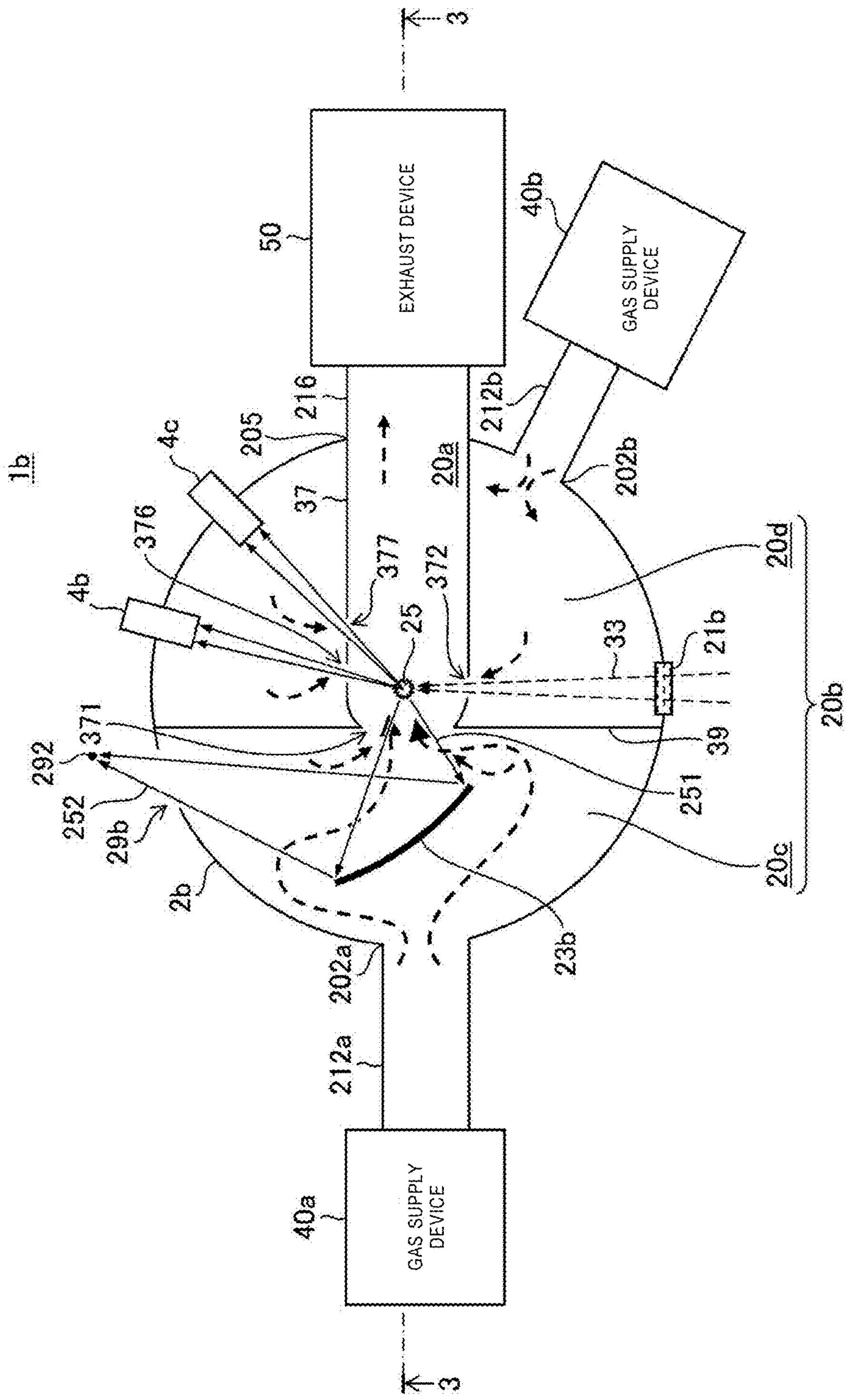
FIG. 2 is a sectional view schematically showing the configuration of an EUV light generation apparatus including a chamber according to a comparative example, and shows a cross section perpendicular to a trajectory of a target.
Figure 3:
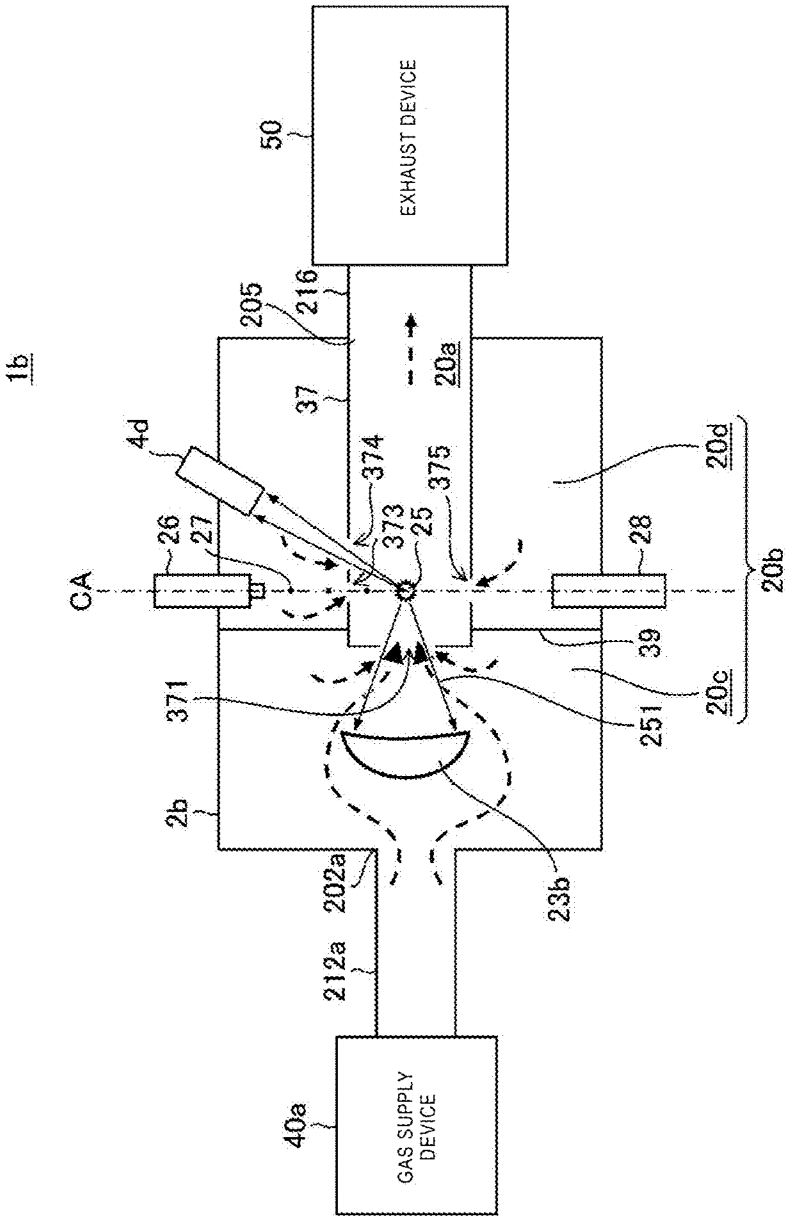
FIG. 3 is a sectional view schematically showing the configuration of the EUV light generation apparatus including the chamber according to the comparative example, and shows a cross section perpendicular to the optical axis of the pulse laser light.

FIGS. 2 and 3 are sectional views each schematically showing the configuration of generation apparatus 1*b* including a chamber 2*b* according to a comparative example. The comparative example of the present disclosure is an example recognized by the applicant as known only by the applicant, and is not a publicly known example admitted by the applicant. FIG. 2 shows a cross section perpendicular to the trajectory of the target 27, and FIG. 3 shows a cross section perpendicular to the optical path axis of the pulse laser light 33. FIG. 3 corresponds to a sectional view taken along line 3-3 of FIG. 2. Since line 3-3 of FIG. 2 passes substantially through the center of the EUV light concentrating mirror 23*b*, the EUV light concentrating mirror 23*b* is shown in a substantially semi-elliptical shape in FIG. 3.

The EUV light generation apparatus 1*b* is an example in which a first partition wall 37 and a second partition wall 39 are arranged in the chamber 2*b*. The first partition wall 37 is arranged to partition a first space 20*a* including the plasma generation region 25 in the chamber 2*b* and a second space 20*b* in which the EUV light concentrating mirror 23*b*, a sensor 4*b*, and the like are arranged. The first partition wall 37 may be referred to as a debris shield because of having a function to suppress diffusion of tin debris into the chamber 2*b*. The second partition wall 39 separates the second space 20*b* in the chamber 2*b* into a third space 20*c* and a fourth space 20*d*.

According to the configuration of the EUV light generation apparatus 1*b*, it is possible to suppress tin from adhering to the EUV light concentrating mirror 23*b* and sensors 4*b*, 4*c*, 4*d*. Further, according to this configuration, a through hole through which the pulse laser light 33 passes is not required to be formed at the EUV light concentrating mirror 23*b*.

The chamber 2*b* has a substantially cylindrical shape. As shown in FIG. 3, the target supply unit 26 and the target collection unit 28 are each arranged outside the first partition wall 37 at a position on a cylindrical center axis CA in the chamber 2*b*. The plasma generation region 25 is located inside the first partition wall 37 at a position between the target supply unit 26 and the target collection unit 28.

As shown in FIG. 2, the chamber 2*b* is provided with a window 21*b* for causing the pulse laser light 33 to enter the chamber 2*b*. A laser light concentrating mirror (not shown) is arranged outside the window 21*b* (outside the chamber 2*b*).

The sensors 4*b*, 4*c*, 4*d* are attached to the chamber 2*b*. The sensors 4*b*, 4*c*, 4*d* may include, for example, a target sensor for detecting at least one of the presence, trajectory, position, and velocity of the target 27, or may include a sensor for detecting an emission point of the EUV light. Although not shown, each of the sensors 4*b*, 4*c*, 4*d* may include an image sensor or an optical sensor, and an optical system that forms an image of the plasma generation region 25 inside the first partition wall 37 or the vicinity thereof on the image sensor or the optical sensor. A light source that illuminates the plasma generation region 25 with visible light may be arranged at any one position of the sensors 4*b*, 4*c*, 4*d* instead of the corresponding sensor.

The first partition wall 37 is made of stainless steel or metal molybdenum. The first partition wall 37 has a cylindrical shape. The first partition wall 37 penetrates the side surface of the chamber 2*b*.

A part of the first partition wall 37 is located in the chamber 2*b* and is arranged to cover the plasma generation region 25. In the chamber 2*b*, the first partition wall 37 has openings 371 to 377. The openings 371 to 377 provide communication between the first space 20*a* in the chamber 2*b* at the inside of the first partition wall 37 and the second space 20*b* in the chamber 2*b* at the outside of the first partition wall 37. The opening 371 is an opening through which the radiation light 251 including EUV light passes. The opening 372 is an opening through which the pulse laser light 33 passes. The opening 373 and the opening 375 are openings through which the target 27 passes. The openings 374, 376, 377 are openings for sensors.

The openings 374, 376, 377 are located between the plasma generation region 25 and the sensors 4*d*, 4*b*, 4*c*, respectively. Accordingly, light emitted from the plasma generation region 25 or the vicinity thereof reaches the sensors 4*d*, 4*b*, 4*c*. Alternatively, light output from a light source located at any one of the positions of the sensors 4*d*, 4*b*, 4*c* reaches the plasma generation region 25. Thus, the openings 374, 376, 377 allow light for observing a part of the first space 20*a* to pass therethrough.

The EUV light concentrating mirror 23*b* has a spheroidal reflection surface. The EUV light concentrating mirror 23*b* is located in the third space 20*c* in the chamber 2*b* at the outside of the first partition wall 37. The EUV light concentrating mirror 23*b* has the first focal point located in the plasma generation region 25 and the second focal point located at the intermediate focal point 292. The opening 371 of the first partition wall 37 is located on the optical path of the radiation light 251 generated at the plasma generation region 25 and directed toward the EUV light concentrating mirror 23*b*.

An opening 29*b* of the chamber 2*b* is located on the optical path of the reflection light 252 directed toward the intermediate focal point 292 from the EUV light concentrating mirror 23*b*. The EUV light concentrating mirror 23*b* is arranged such that the center axis of the optical path of the reflection light 252 is inclined with respect to the center axis of the optical path of the radiation light 251.

The chamber 2*b* includes two gas supply ports (a first gas supply port 202*a* and a second gas supply port 202*b*) and one gas exhaust port 205. The first gas supply port 202*a* is connected to the gas supply device 40*a* via the first gas supply pipe 212*a*. The second gas supply port 202*b* is connected to the gas supply device 40*b* via the second gas supply pipe 212*b*. The gas supply devices 40*a*, 40*b* may include a gas cylinder (not shown). The gas is supplied to the third space 20*c* of the chamber 2*b* through the first gas supply port 202*a*, and the gas is supplied to the fourth space 20*d* of the chamber 2*b* through the second gas supply port 202*b*. The gas supplied from the gas supply devices 40*a*, 40*b* to the chamber 2*b* includes a hydrogen gas. Instead of providing the gas supply device 40*b*, the gas supply device 40*a* may also serve as the gas supply device 40*b*.

The first partition wall 37 serves as an exhaust pipe for exhausting the gas in the chamber 2*b* to the outside of the chamber 2*b*. The opening 371 functions as an inlet port for the gas to be exhausted. The first partition wall 37 is connected to the gas exhaust port 205, and the gas exhaust port 205 is connected to the exhaust device 50 via the exhaust pipe 216. The exhaust pipe 216 may be integrally formed with the first partition wall 37.

The exhaust device 50 exhausts the gas in the first space 20*a* at the inside of the first partition wall 37 to the space outside the chamber 2*b* at the outside of the first partition wall 37 through the gas exhaust port 205. As a result, the pressure in the first space 20*a* is maintained lower than the pressure in the second space 20*b*. Consequently, through the openings 371 to 377, the gas flows from the second space 20*b* toward the first space 20*a* as indicated by the dashed arrows in FIGS. 2 and 3.

The gas supplied from the second gas supply port 202*b* passes through the openings 372 to 377, passes through the vicinity of the plasma generation region 25, and is exhausted to the outside of the chamber 2*b*. Therefore, movement of tin debris from the first space 20*a* to the second space 20*b* is suppressed, and the accumulation of tin debris on the EUV light concentrating mirror 23 or the like is suppressed.

3.2 Operation

The target 27 output from the target supply unit 26 passes through the opening 373 and reaches the plasma generation region 25. Among the plurality of targets 27, the targets 27 without being irradiated with the pulse laser light 33 and without being turned into plasma pass through the plasma generation region 25, further pass through the opening 375, and reach the target collection unit 28.

The pulse laser light 33 passes through the opening 372, enters the inside of the first partition wall 37, and causes the target 27 to be turned into plasma by being radiated to the target 27 at the plasma generation region 25.

The gas supply device 40*a* supplies the gas to the third space 20*c* in the chamber 2*b* at the outside of the first partition wall 37 through the first gas supply port 202*a*. The gas flow rate at the first gas supply port 202*a* is, for example, not less than 40 nlm and not more than 60 nlm. While the laser light generation unit 3 is in operation, the gas supply devices 40*a*, 40*b* continue to supply the gas to the chamber 2*b*, and the exhaust device 50 continues to exhaust, from the chamber 2*b*, the gas in the chamber 2*b*.

Figure 4:
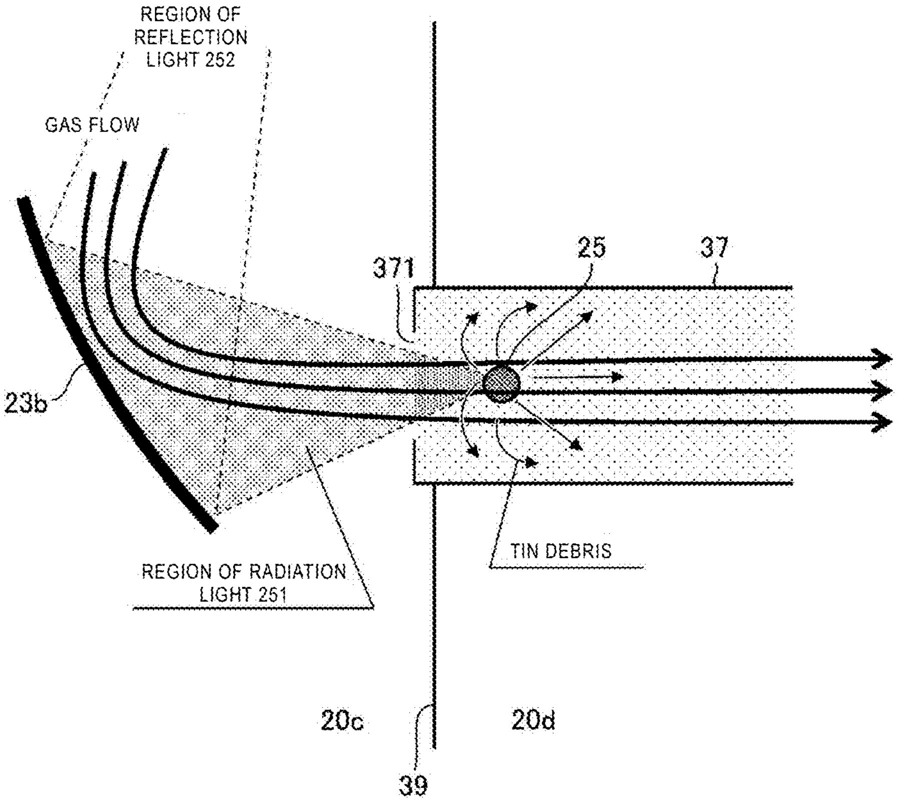
FIG. 4 is a partially enlarged view of FIG. 2.

FIG. 4 is a partially enlarged view of FIG. 2. The third space 20*c* in which the EUV light concentrating mirror 23*b* is arranged is in communication with the gas exhaust port 205 through the opening 371. The position and opening diameter of the opening 371 are set so that the entire reflection surface of the EUV light concentrating mirror 23*b* can be seen from the plasma generation region 25. Therefore, as shown in FIG. 4, the gas exhausted through the first partition wall 37 vigorously travels from all positions of the reflection surface of the EUV light concentrating mirror 23*b* toward the plasma generation region 25. In other words, the gas travels in the region of the radiation light 251 surrounded by the plasma generation region 25 and the reflection surface of the EUV light concentrating mirror 23*b* in a direction generally opposite to the radiation light 251.

Some of the plasma debris generated by plasmatization travels toward the EUV light concentrating mirror 23*b*, but is stopped before reaching the EUV light concentrating mirror 23*b* as being blocked by the flow of the hydrogen gas, and then, is eventually exhausted together with the hydrogen gas. Thus, contamination is suppressed at every position of the reflection surface of the EUV light concentrating mirror 23*b*.

When the flow of the hydrogen gas is weak, a part of tin debris travels through the region of the radiation light 251 toward the EUV light concentrating mirror 23*b*. Accordingly, the region of the radiation light 251 is also referred to as a "tin debris scattering region."

On the other hand, the hydrogen gas supplied from the second gas supply port 202*b* is exhausted from the openings 372 to 377 to the outside of the chamber 2*b* through the first space 20*a* inside the first partition wall 37. By causing such a flow of the gas, intrusion of tin debris into the fourth space 20*d* is suppressed, and contamination of elements such as the sensors 4*b* to 4*d* and the window 21*b* is suppressed.

The radiation light 251 including the EUV light generated at the plasma generation region 25 passes through the opening 371 and is incident on the EUV light concentrating mirror 23*b*. The EUV light concentrating mirror 23*b* concentrates the EUV light on the intermediate focal point 292 by reflecting the EUV light.

The opening 371 is located outside the optical path of the reflection light 252 including the EUV light reflected by the EUV light concentrating mirror 23*b*. Therefore, it is possible to suppress some of the reflection light 252 from entering the opening 371 to be wasted. Furthermore, the first partition wall 37 is located outside the optical path of the reflection light 252. Therefore, it is possible to suppress some of the reflection light 252 from entering the first partition wall 37 to be wasted.

3.3 Problem

Figure 5:
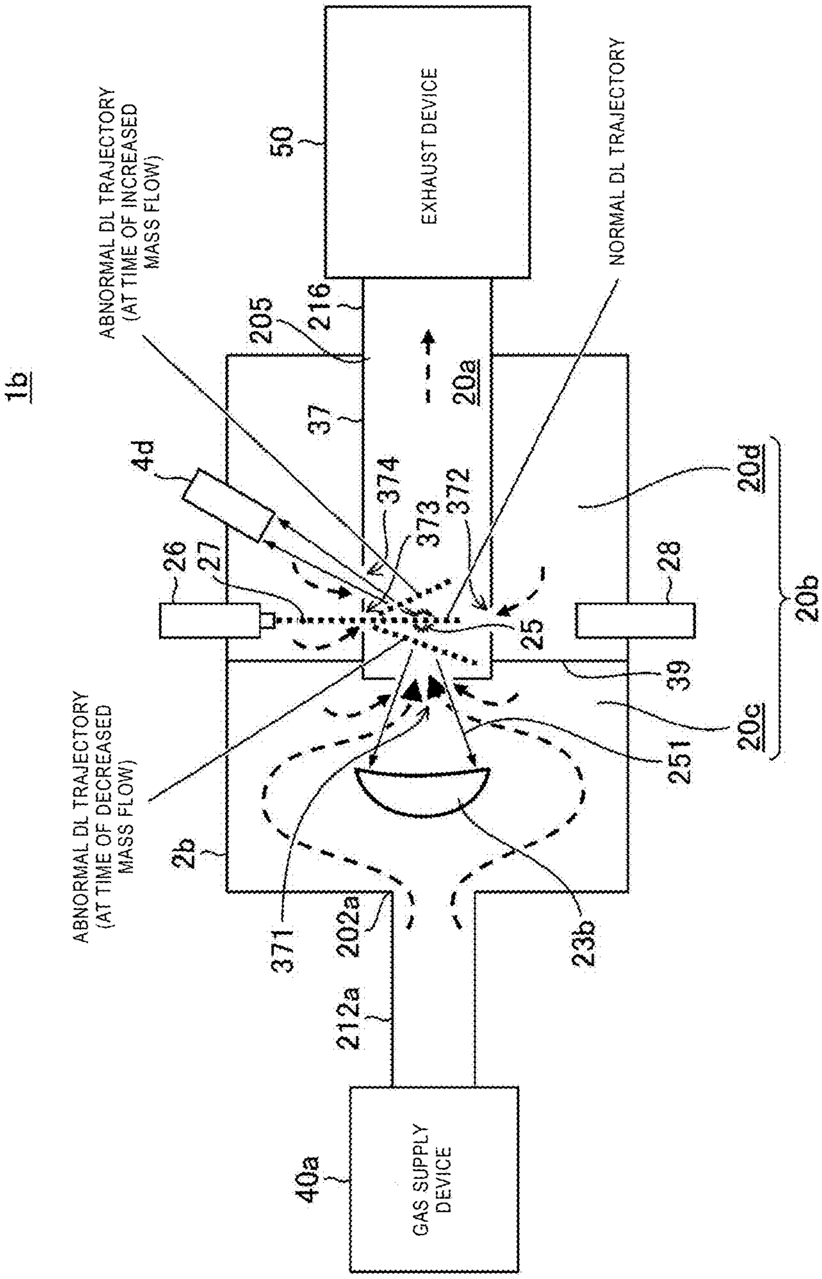
FIG. 5 is an explanatory view showing variation of the droplet trajectory due to variation of a gas flow rate in the chamber.

FIG. 5 is an explanatory view showing variation of the droplet trajectory due to variation of the gas flow rate in the chamber 2*b*. FIG. 5 corresponds to a sectional view taken along line 3-3 of FIG. 2.

Out of the hydrogen gas supplied for suppressing adhesion of tin to the EUV light concentrating mirror 23*b*, all the hydrogen gas to be exhausted is exhausted after passing through a region including the droplet trajectory being a straight line connecting the plasma generation region 25 and the outlet port of the target supply unit 26, as shown in FIG. 5. Since the travel direction of the droplet is bent by the gas flow in the direction crossing the droplet trajectory, the processor 5 adjusts the position of the target supply unit 26 so that the droplet supplied from the outlet port of the target supply unit 26 finally reaches the plasma generation region 25.

Laser irradiation of the droplet heats the surrounding gas, whereby the distribution of the gas temperature, gas pressure, and flow velocity in the surrounding region changes with time. When the gas flow in the direction crossing the droplet trajectory changes with time, the plasma generation position where the droplet reaches also changes with time. This causes a deviation between the droplet position and the laser irradiation position. Normally, the EUV light generation apparatus 1*b* is operated under a gas flow rate condition under which the positional deviation amount falls within an allowable range.

To improve the EUV light source output, the laser output may be increased or the number of repetition per unit time of laser irradiation may be increased in a system including the EUV light generation apparatus 1*b*. In this case, the initial energy of tin debris and the amount of generated debris increase. There is also a method of reducing the pressure in the chamber 2*b* to reduce the EUV light absorption amount on the optical path in the chamber 2*b*. In this case, the stopping ability of tin debris is lowered due to the decrease in the hydrogen molecular density. As measures therefor, it is required to improve the contamination suppressing effect the of EUV light concentrating mirror 23*b*. The "contamination suppressing effect" refers to an effect in which, as the gas flow rate flowing from the EUV light concentrating mirror 23*b* toward the plasma generation region 25 increases, the traveling of tin debris toward the EUV light concentrating mirror 23*b* is disturbed, and the quantity of the debris reaching the EUV light concentrating mirror 23*b* decreases.

When the hydrogen gas flow rate is increased to increase the contamination suppressing effect, the change of the gas flow with time becomes large. The variation or enlargement of the droplet trajectory caused by the change of the gas flow with time leads to the enlargement of the displacement amount of the droplet reaching the plasma generation region 25, and as a result, the stability of the laser irradiation is lowered. That is, the deviation between the droplet position and the laser irradiation position is enlarged.

As described above, the contamination suppressing effect and the condition of the gas flow rate for stable irradiation of the laser light to the droplet are contradictory.

Regarding the hydrogen gas supplied from the second gas supply port 202*b* shown in FIG. 2, the inflow amount of the gas from the openings 372 to 377 to the inside of the first partition wall 37 is smaller than the gas flow rate from the opening 371 to the inside of the first partition wall 37 for suppressing the adhesion of tin to the EUV light concentrating mirror 23*b*, and the openings 372 to 377 are arranged downstream the droplet trajectory, so that the effect on the droplet trajectory is small.

4. First Embodiment

4.1 Configuration

Figure 6:
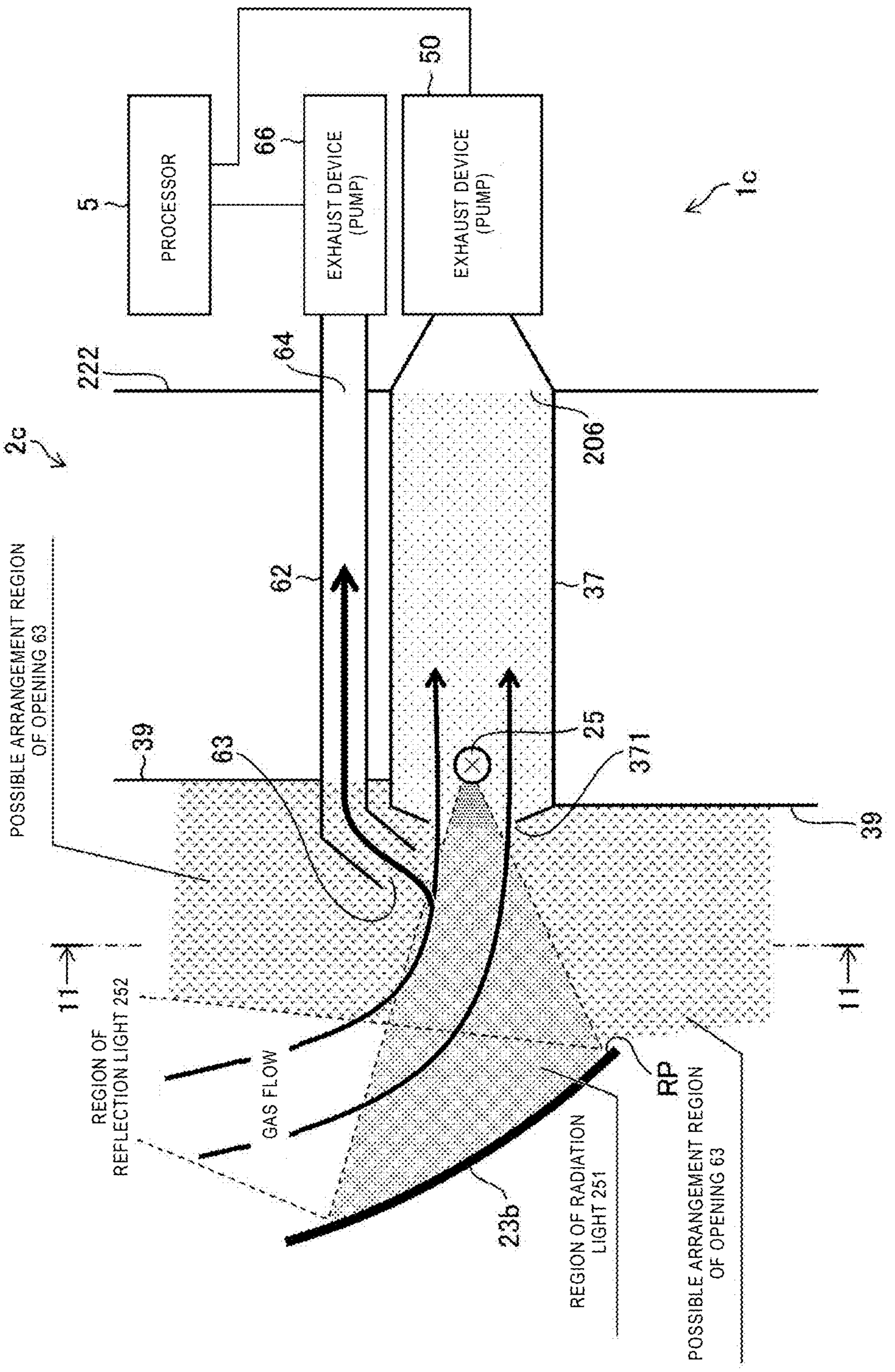
FIG. 6 is a view schematically showing a part of the configuration of the EUV light generation apparatus including the chamber according to a first embodiment.

FIG. 6 is a view schematically showing a part of the configuration of an EUV light generation apparatus 1*c* including a chamber 2*c* according to a first embodiment. The configuration shown in FIG. 6 will be described in terms of differences from the EUV light generation apparatus 1*b* according to the comparative embodiment.

As shown in FIG. 6, the chamber 2*c* includes the first partition wall 37 as a first exhaust pipe, and further includes a second exhaust pipe 62 and a dedicated exhaust device 66 with respect to the configuration of the chamber 2*b* according to the comparative embodiment. The exhaust device 66 includes a pump (not shown). Hereinafter, the "first partition wall 37" is referred to as the "first exhaust pipe 37." The first exhaust pipe 37 includes an exhaust port 206 for exhausting the gas in the chamber 2*c* to the outside of the chamber 2*c*, and the exhaust port 206 is connected to the exhaust device 50.

The second exhaust pipe 62 includes an opening 63 through which the gas supplied into the chamber 2*c* is sucked, and an exhaust port 64 through which the gas is exhausted to the outside of the chamber 2*c*. The opening 63 of the second exhaust pipe 62 is arranged at a position in the chamber 2*c*, the position being on the side toward the plasma generation region 25 (toward the second partition wall 39) from a reflection point RP of the EUV light concentrating mirror 23*b* closest to the plasma generation region 25 of the EUV light generation apparatus 1*c* and being outside the region of the radiation light 251 traveling from the plasma generation region 25 toward the reflection surface of the EUV light concentrating mirror 23*b* and outside the region of the reflection light 252 traveling from the reflection surface of the EUV light concentrating mirror 23*b* toward the intermediate focal point 292. When the opening 63 is arranged at such a position, the second exhaust pipe 62 does not interfere with the traveling of the radiation light 251 or the supplying of the gas to the EUV light concentrating mirror 23*b*. Hereinafter, a region in which the opening 63 can be arranged is referred to as a "possible arrangement region." The opening 63 is preferably arranged as facing toward the optical path of the radiation light 251 on the side toward the end of the first opening 371 from the reflection point RP, of the EUV light concentrating mirror 23*b*, closest to the plasma generation region 25.

In the tin debris scattering region, contamination of the EUV light concentrating mirror 23*b* is suppressed by generating the gas flow in a direction opposite to the direction of traveling of the radiation light 251.

The gas supplied from the first gas supply port 202*a* flows through the tin debris scattering region in a direction away from the EUV light concentrating mirror 23*b*, so that tin debris is exhausted toward the exhaust devices 50, 66. Therefore, it is preferable that the opening 63 of the second exhaust pipe 62 is arranged as close to the tin debris scattering region as possible so that tin debris can be efficiently exhausted.

The exhaust port 64 of the second exhaust pipe 62 is connected to the exhaust device 66. The chamber wall 222 of the chamber 2*c* is provided with a gas exhaust port to which the second exhaust pipe 62 is connected.

The processor 5 of the EUV light generation apparatus 1*c* is electrically connected to the exhaust devices 50, 66, and controls the exhaust devices 50, 66. The remaining configuration may be similar to the configuration of the EUV light generation apparatus 1*b* according to the comparative example (FIGS. 2 to 4).

The exhaust device 50 is an example of the "first exhaust device" in the present disclosure, and the exhaust device 66 is an example of the "second exhaust device" in the present disclosure. The opening 371 is an example of the "first opening" in the present disclosure, and the exhaust port 206 is an example of the "first exhaust port" in the present disclosure. The opening 63 is an example of the "second opening" in the present disclosure, and the exhaust port 64 is an example of the "second exhaust port" in the present disclosure. Hereinafter, the "opening 371" may be referred to as the "first opening 371", and the "opening 63" may be referred to as the "second opening 63." The EUV light concentrating mirror 23*b* is an example of the "light concentrating mirror" in the present disclosure. The region of the radiation light 251 from the plasma generation region 25 toward the reflection surface of the EUV light concentrating mirror 23*b* is an example of the "radiation region of the extreme ultraviolet light" and the "first region" in the present disclosure. The region of the reflection light 252 from the reflection surface of the EUV light concentrating mirror 23*b* toward the intermediate focal point 292 is an example of the "second region" in the present disclosure.

4.2 Operation

In the chamber 2*c*, in addition to exhausting the gas from the first exhaust pipe 37, the gas is also exhausted from the second exhaust pipe 62 to reduce the gas flow rate flowing in the vicinity of the plasma generation region 25.

The gas flow rate flowing in the vicinity of the plasma generation region 25 can be adjusted by the processor 5 controlling the pumps of the respective exhaust devices 50, 66 to adjust the exhaust capacities of the exhaust devices 50, 66. The processor 5 stores in the memory 501 a data set of the operation amounts of the respective pumps to maintain the variation of the droplet trajectory within an allowable value in accordance with the gas flow rate and the number of repeated irradiation of the pulse laser light 33 radiated to the target 27 per unit time. The processor 5 controls each pump by calling the optimum data from the data set in accordance with the flow rate of the hydrogen gas and the repetition conditions of the laser irradiation.

In addition, the data set may be data obtained by determining the distribution of the exhaust capacities of the exhaust devices 50, 66 by setting the sum of the exhaust capacities of the exhaust devices 50, 66 (the total amount of the exhaust capacities) to be constant.

4.3 Effect

According to the EUV light generation apparatus 1*c* including the chamber 2*c* according to the first embodiment, since the opening 63 of the second exhaust pipe 62 is arranged in the possible arrangement region, the gas flow for suppressing the contamination of the EUV light concentrating mirror 23*b* effectively works between the reflection surface of the EUV light concentrating mirror 23*b* and the plasma generation region 25. On the other hand, only the gas passing through the first exhaust pipe 37 after passing through the first opening 371 affects the droplet trajectory.

Owing to that the second opening 63 is arranged in the possible arrangement region between the EUV light concentrating mirror 23*b* and the first opening 371 and a part of the gas is sucked through the second opening 63 and exhausted through the second exhaust pipe 62, the gas flow rate flowing in the vicinity of the EUV light concentrating mirror 23*b* is increased to improve the contamination suppressing effect of the EUV light concentrating mirror 23*b*, and at the same time, it is possible to maintain the same effect on the droplet trajectory as before increase of the gas flow rate. Here, it is preferable that the second opening 63 is arranged at a position close to the tin debris scattering region as much as possible so that a higher mirror contamination suppressing effect can be obtained.

As described above, for example, with respect to the mirror contamination suppressing effect reduced by lowering the chamber pressure in the EUV light generation apparatus 1*b* according to the comparative example, the mirror contamination suppressing effect can be improved by increasing the gas flow rate for suppressing mirror contamination than in the comparative example, so that the mirror contamination suppressing effect can be maintained to be equivalent to or higher than that of the comparative example. As a result, the quantity of the EUV light absorbed by the hydrogen gas is reduced, and the EUV output at the intermediate focal point 292 can be improved.

According to the first embodiment, there is provided the chamber 2*c* for generating EUV light capable of stably irradiating a droplet target with laser light even when an irradiation condition with laser light or a pressure condition of a hydrogen gas is changed to improve the output of the EUV light.

5. Second Embodiment 5.1 Configuration

Figure 7:
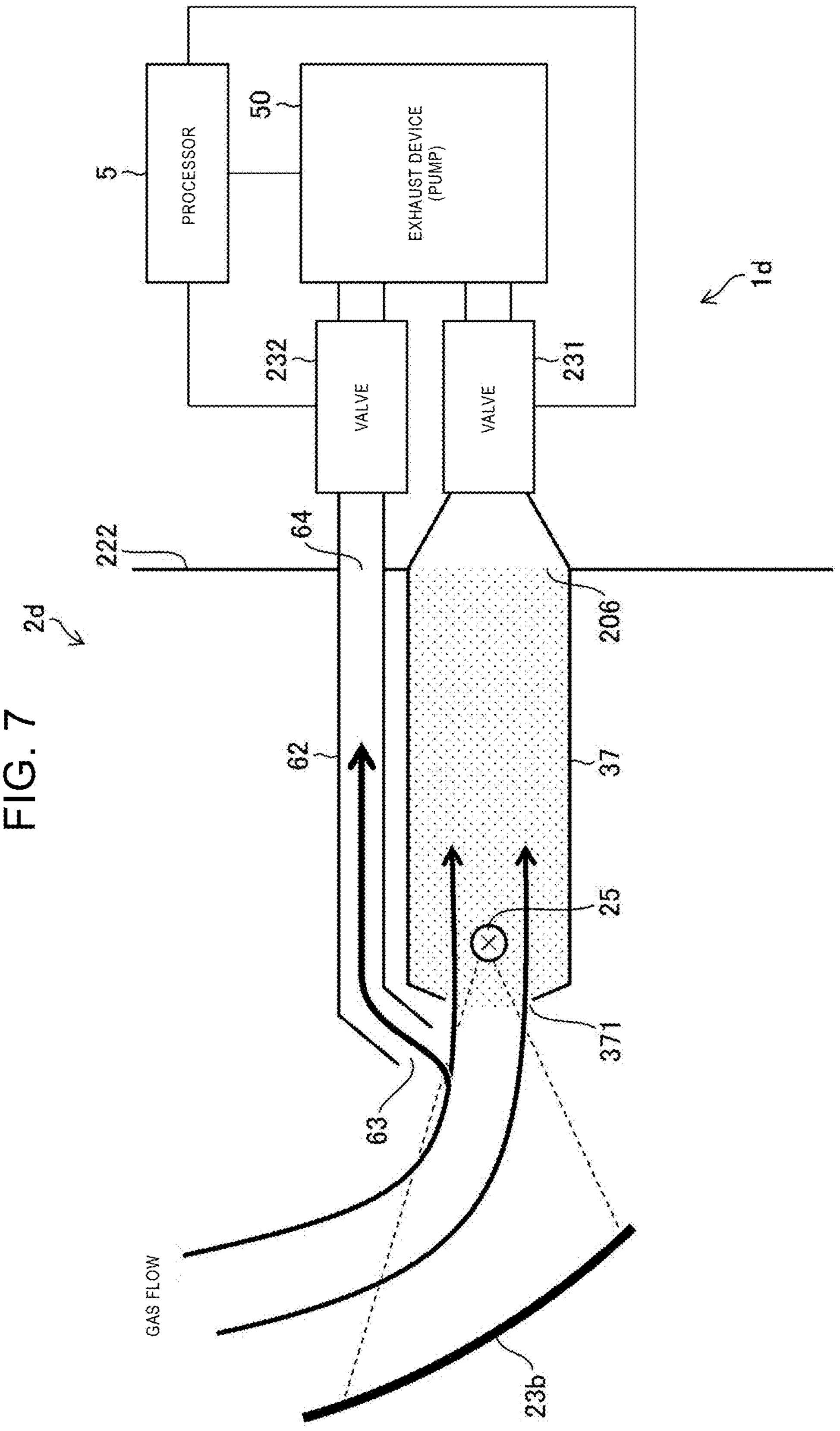
FIG. 7 is a view schematically showing a part of the configuration of the EUV light generation apparatus including the chamber according to a second embodiment.

FIG. 7 is a view schematically showing a part of the configuration of an EUV light generation apparatus 1*d* including a chamber 2*d* according to a second embodiment. The configuration shown in FIG. 7 will be described in terms of differences from the configuration shown in FIG. 6.

In the EUV light generation apparatus 1*d*, as shown in FIG. 7, the exhaust device 50 is commonly used for the first exhaust pipe 37 and the second exhaust pipe 62. That is, the exhaust device 50 of FIG. 7 serves as the exhaust device 50 and the exhaust device 66 of FIG. 6. In FIG. 7, the second partition wall 39 is not shown. The same applies to FIGS. 8 to 10.

The first exhaust pipe 37 and the second exhaust pipe 62 are provided with valves 231, 232 respectively for adjusting the exhaust amount. The first exhaust pipe 37 is connected to the exhaust device 50 via the valve 231, and the second exhaust pipe 62 is connected to the exhaust device 50 via the valve 232. Opening degrees of the valves 231, 232 can be adjusted. Each of the valves 231, 232 is electrically connected to the processor 5, and the opening degree thereof can be adjusted by a command from the processor 5. Alternatively, the opening degrees of the valves 231, 232 can be manually adjusted. By adjusting the opening degrees of the valves 231, 232, the exhaust amount can be adjusted. The processor 5 may be configured to control at least one of the pump of the exhaust device 50 and the valves 231, 232 with the total exhaust amount of the gas kept constant. Other configurations may be similar to those of the first embodiment. The valve 231 is an example of the "first valve" in the present disclosure, and the valve 232 is an example of the "second valve" in the present disclosure.

5.2 Operation

The EUV light generation apparatus 1*d* operates in a similar manner as the EUV light generation apparatus 1*c* according to the first embodiment, but the exhaust capacity of each of the first exhaust pipe 37 and the second exhaust pipe 62 is adjusted by adjusting the opening degree of each of the valves 231, 232 with the pump of the exhaust device 50 operated constantly. The adjustment of the opening degrees is performed by the processor 5. Alternatively, the opening degrees of the valves 231, 232 may be manually adjusted.

5.3 Effect

According to the EUV light generation apparatus 1*d*, since the exhaust device 50 is commonly used, the volume therefor can be reduced.

6. Third Embodiment 6.1 Configuration

Figure 8:
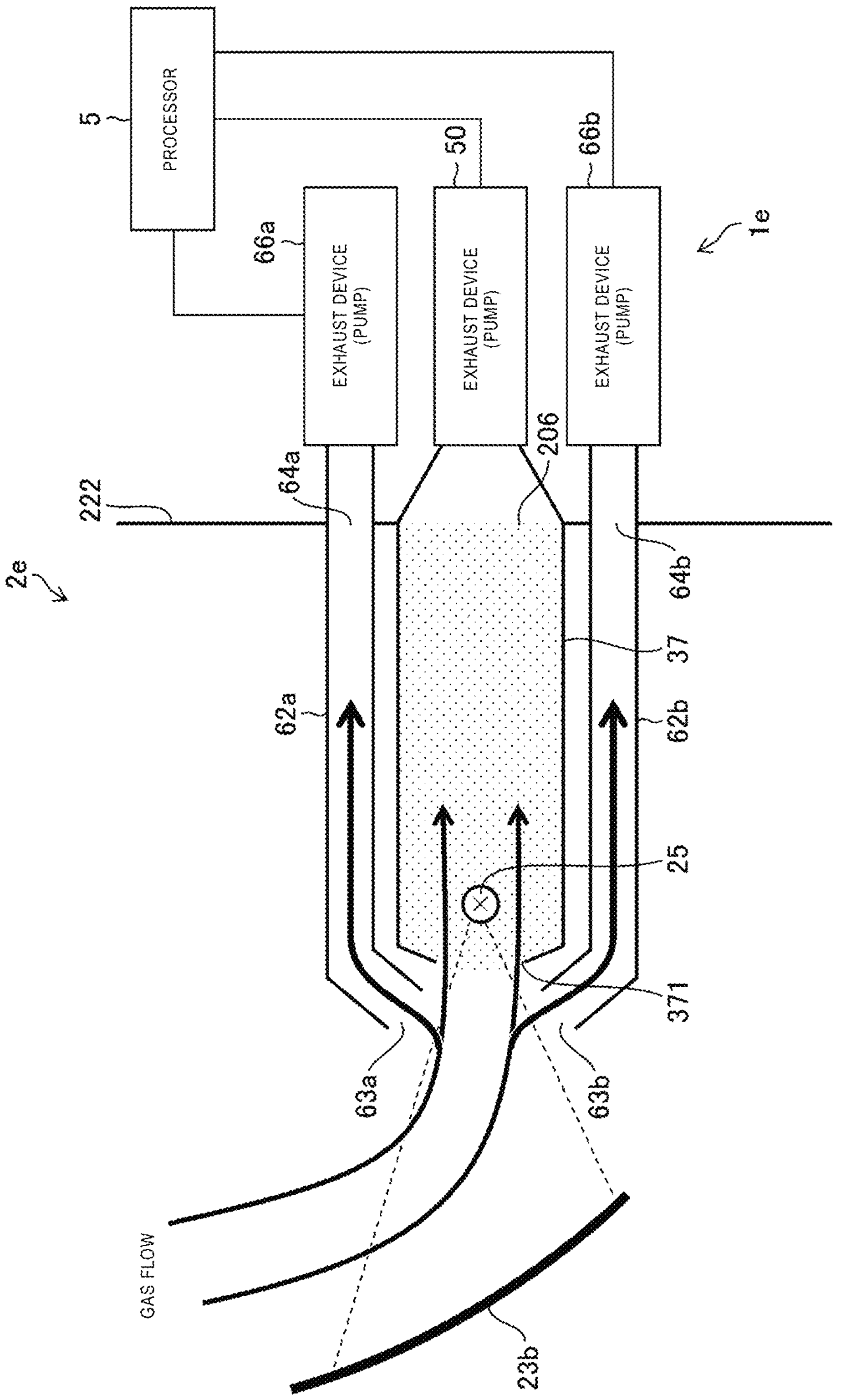
FIG. 8 is a view schematically showing a part of the configuration of the EUV light generation apparatus including the chamber according to a third embodiment.

FIG. 8 is a view schematically showing a part of the configuration of an EUV light generation apparatus 1*e* including a chamber 2*e* according to a third embodiment. The configuration shown in FIG. 8 will be described in terms of differences from the configuration shown in FIG. 6.

As shown in FIG. 8, the EUV light generation apparatus 1*e* includes a plurality of second exhaust pipes 62*a*, 62*b* and dedicated exhaust devices 66*a*, 66*b* connected to exhaust ports 64*a*, 64*b* of the second exhaust pipes 62*a*, 62*b*, respectively. Each of the exhaust devices 66*a*, 66*b* includes a pump (not shown) and is electrically connected to the processor 5.

Openings 63*a*, 63*b* of the second exhaust pipes 62*a*, 62*b* are arranged in the possible arrangement region. The chamber wall 222 of the chamber 2*e* is provided with gas exhaust ports to which the second exhaust pipes 62*a*, 62*b* are connected.

Further, the processor 5 of the EUV light generation apparatus 1*e* controls the exhaust devices 50, 66*a*, 66*b*. Other configurations may be similar to those of the first embodiment. Each of the exhaust devices 66*a*, 66*b* is an example of the "second exhaust device" in the present disclosure.

6.2 Operation

The EUV light generation apparatus 1*e* operates in a similar manner as the EUV light generation apparatus 1*c* according to the first embodiment, and further, the exhaust capacity of the exhaust device 66*b* is adjusted.

6.3 Effect

According to the third embodiment, since the second exhaust pipe 62*b* is added as compared with the first embodiment, the gas flow rate flowing in the vicinity of the plasma generation region 25 can be adjusted with higher accuracy.

6.4 First Modification of Third Embodiment 6.4.1 Configuration

Figure 9:
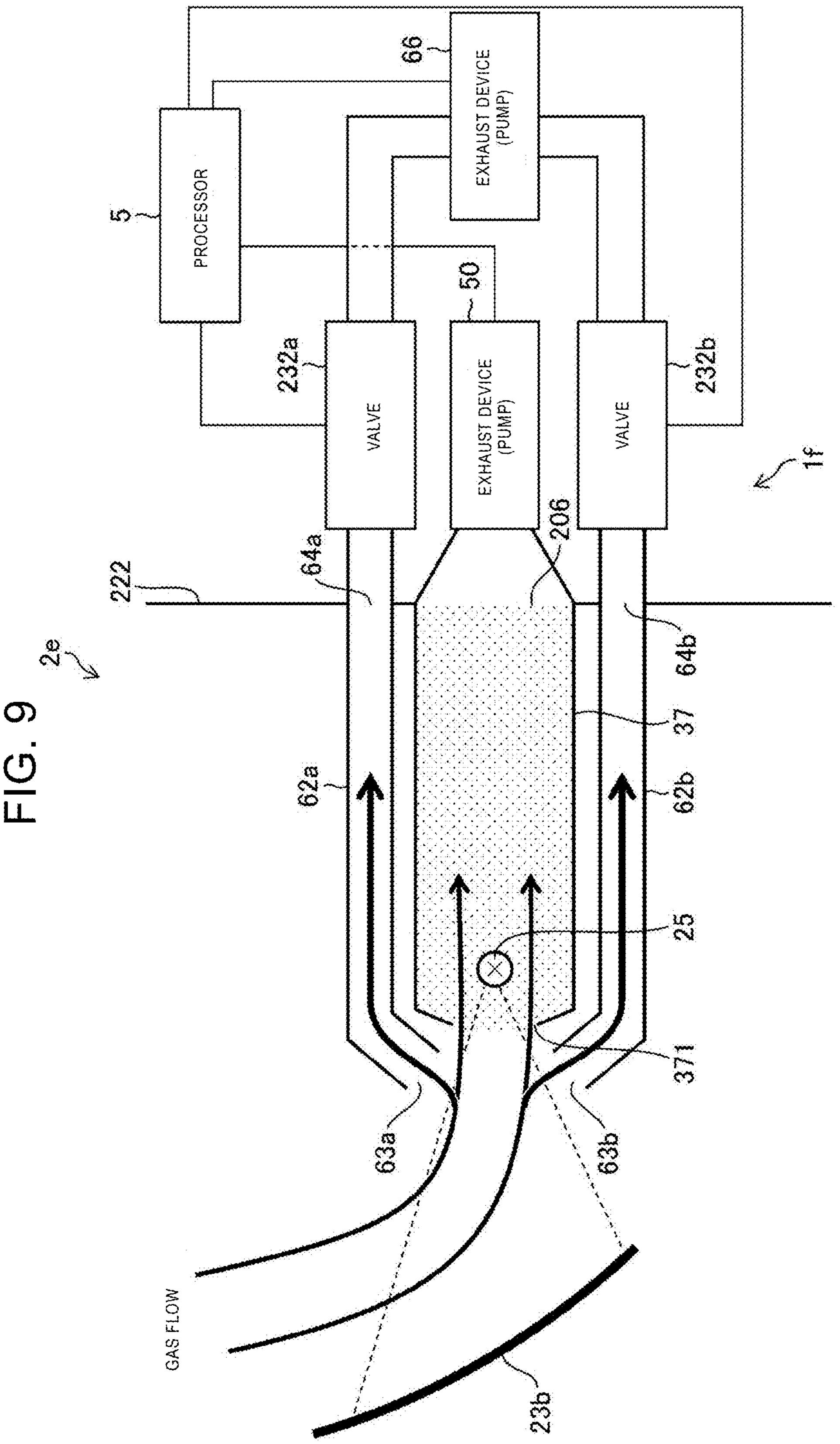
FIG. 9 is an explanatory view schematically showing a part of the configuration of the EUV light generation apparatus according to a first modification of the third embodiment.

FIG. 9 is an explanatory view including a partially enlarged view schematically showing the configuration of an EUV light generation apparatus 1*f* according to a first modification of the third embodiment. The configuration shown in FIG. 9 will be described in terms of differences from the configuration shown in FIG. 8.

In the EUV light generation apparatus 1*f*, as shown in FIG. 9, the exhaust device 66 connected to the second exhaust pipes 62*a*, 62*b* is commonly used. The second exhaust pipes 62*a*, 62*b* are provided with valves 232*a*, 232*b*, respectively. The opening degrees of the valves 232*a*, 232*b* can be adjusted, and the exhaust capacity of the exhaust device 66 can be adjusted. The valves 232*a*, 232*b* and the exhaust device 66 may be electrically connected to the processor 5. Other configurations may be similar to those in FIG. 8.

6.4.2 Operation

The exhaust capacity of each of the second exhaust pipes 62*a*, 62*b* in the EUV light generation apparatus 1*f* is adjusted by adjusting the opening degrees of the respective valves 232*a*, 232*b* with the pump of the exhaust device 66 operated constantly. Other operation is similar to that of the EUV light generation apparatus 1*e* of the third embodiment.

6.4.3 Effects

According to the EUV light generation apparatus 1*f*, since the exhaust device 66 is commonly used, the volume therefor can be reduced. Further, since the exhaust capacities of the second exhaust pipes 62*a*, 62*b* are adjusted by the valves 232*a*, 232*b*, the gas flow rate flowing in the vicinity of the plasma generation region 25 can be adjusted with higher accuracy.

6.5 Second Modification of Third Embodiment 6.5.1 Configuration

Figure 10:
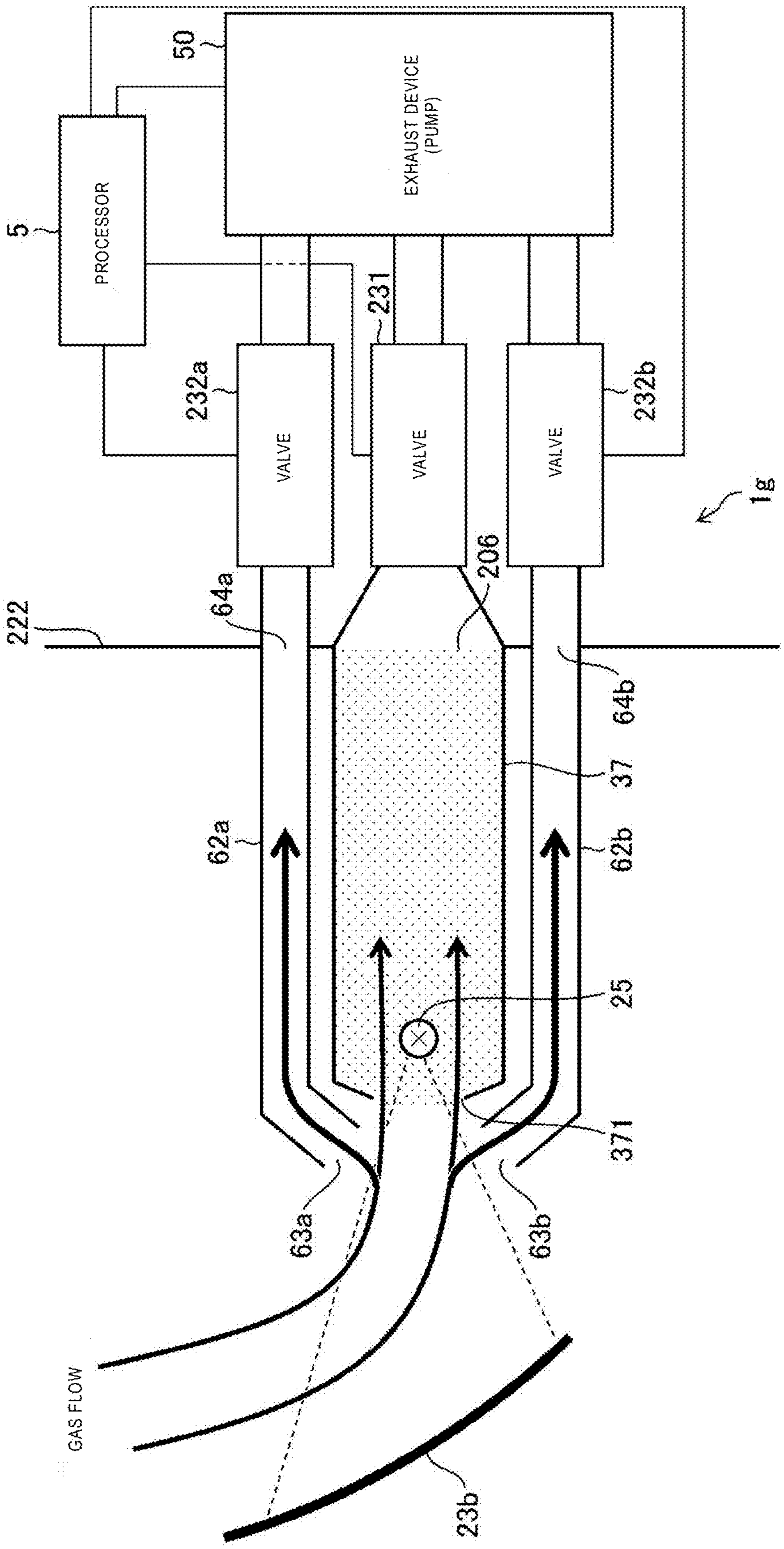
FIG. 10 is an explanatory view schematically showing a part of the configuration of the EUV light generation apparatus according to a second modification of the third embodiment.

FIG. 10 is an explanatory view schematically showing a part of the configuration of an EUV light generation apparatus 1*g* according to a second modification of the third embodiment. The configuration shown in FIG. 10 will be described in terms of differences from the configuration shown in FIG. 9.

In the EUV light generation apparatus 1*g*, all the exhaust devices of the exhaust device 50, 66*a*, 66*b* shown in FIG. 9 are commonalized. That is, as shown in FIG. 10, the EUV light generation apparatus 1*g* includes the exhaust device 50 to which the first exhaust pipe 37 and the second exhaust pipes 62*a*, 62*b* are connected. The valve 231 is provided in the first exhaust pipe 37, and the valves 232*a*, 232*b* are provided in the second exhaust pipes 62*a*, 62*b*, respectively. The opening degrees of the valves 231, 232*a*, 232*b* can be adjusted. The valves 231, 232*a*, 232*b* may be electrically connected to the processor 5.

6.5.2 Operation

The exhaust capacities of the exhaust pipes being the first exhaust pipe 37 and the second exhaust pipes 62*a*, 62*b* in the EUV light generation apparatus 1*g* are adjusted by adjusting the openings of the valves 231, 232*a*, 232*b* with the pump of the exhaust device 50 operated constantly. Other operation is similar to that of the EUV light generation apparatus 1*e* of the third embodiment.

6.5.3 Effects

According to the EUV light generation apparatus 1*g*, since the exhaust device 50 is commonly used, the volume therefor can be reduced. Since the exhaust capacities of all the exhaust pipes including the first exhaust pipe 37 and the second exhaust pipes 62*a*, 62*b* are adjusted by the valves 231, 232*a*, 232*b*, the gas flow rate flowing in the vicinity of the plasma generation region 25 can be adjusted with higher accuracy.

7. Arrangement Position of Opening of Second Exhaust Pipe

FIGS. 11 to 14 are views each showing an example of the position of the opening 63 of the second exhaust pipe 62 when viewed from the direction of line 11-11 of FIG. 6.

Figure 11:
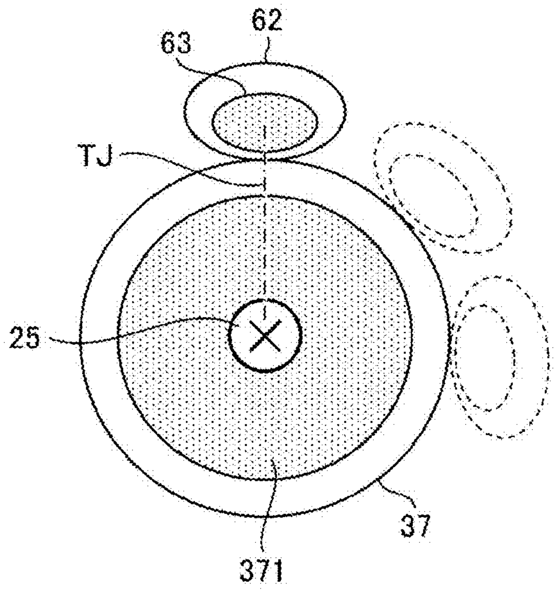
FIG. 11 is a view showing an example of an arrangement position of an opening of a second exhaust pipe.

FIG. 11 shows an example of a case in which a single second exhaust pipe 62 is arranged. The opening 63 of the second exhaust pipe 62 may be arranged anywhere in the periphery of the first opening 371, but is most preferably arranged at a position overlapping a trajectory TJ of the droplet target as shown in FIG. 11. Here, positions for the second exhaust pipe 62 indicated by broken lines in FIG. 11 indicate that the second exhaust pipe 62 may be arranged at other positions in the periphery of the first opening 371.

Figure 12:
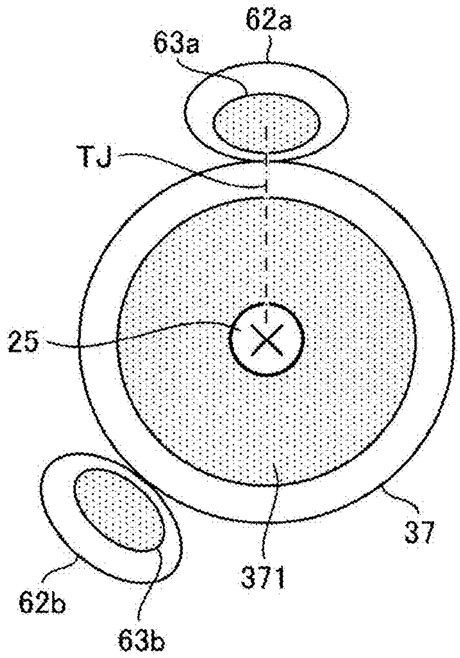
FIG. 12 is a view showing an example of arrangement positions of openings of second exhaust pipes.

FIG. 12 shows an example of a case in which a plurality of second exhaust pipes 62 are arranged. The openings 63*a*, 63*b* of the plurality of second exhaust pipes 62*a*, 62*b* may be arranged anywhere in the periphery of the first opening 371, but as shown in FIG. 12, it is most preferable that one opening (e.g., the opening 63*a*) is arranged at a position overlapping the trajectory TJ of the droplet target.

Figure 13:
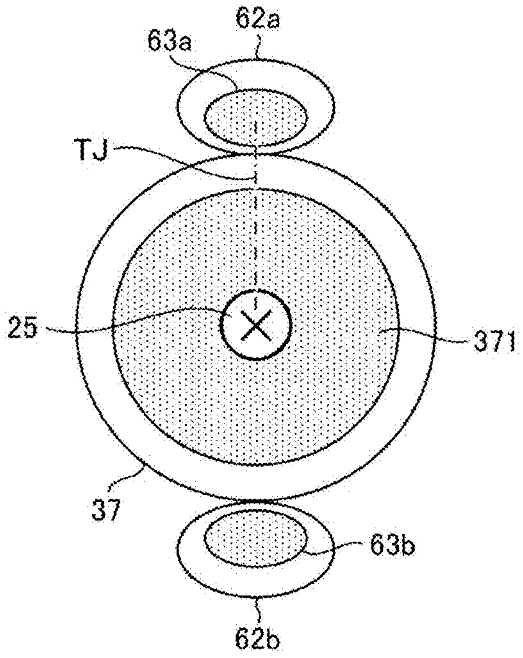
FIG. 13 is a view showing an example of arrangement positions of openings of the second exhaust pipes.

FIG. 13 shows another example of a case in which a plurality of second exhaust pipes 62 are arranged. The openings 63*a*, 63*b* of the plurality of second exhaust pipes 62*a*, 62*b* may be arranged in line symmetry with respect to the trajectory TJ of the droplet target in the periphery of the first opening 371, but as shown in FIG. 13, it is most preferable that two openings (e.g., the openings 63*a*, 63*b*) are arranged at positions overlapping the trajectory TJ of the droplet target.

Figure 14:
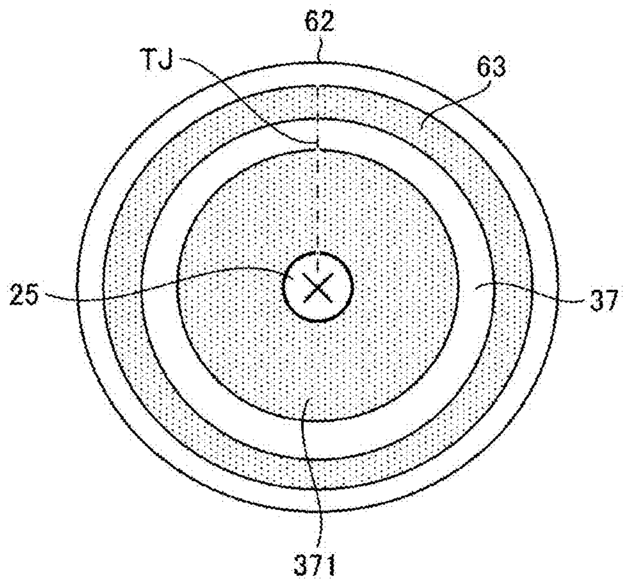
FIG. 14 is a view showing an example of arrangement positions of an opening of the second exhaust pipe.

FIG. 14 shows another example of a case in which a single second exhaust pipe 62 is arranged. As shown in FIG. 14, the opening 63 of the second exhaust pipe 62 may be arranged to surround the first exhaust pipe 37 in a ring shape over the entire length. That is, the second exhaust pipe 62 may cover the first exhaust pipe 37 over the entire length.

Here, in any of the forms shown in FIGS. 11 to 14, the first opening 371 and the second openings (63, 63*a*, 63*b*) may have various shapes, such as a circular shape, an oval shape, a polygonal shape, and the like. Further, FIGS. 12 and 13 show examples including two second exhaust pipes 62*a*, 62*b*, but it is also possible to adopt a configuration including three or more second exhaust pipes.

By selecting the number of the second exhaust pipes and the positions of the openings in accordance with the bias of the gas flow from the EUV light concentrating mirror 23*b* toward the plasma generation region 25, the exhausting from the second exhaust pipes can be facilitated and the exhaust device can be downsized.

When the gas flow is biased to the trajectory TJ of the droplet target, the gas flow rate flowing to the trajectory TJ of the droplet target is easily suppressed by arranging the opening (63, 63*a*, 63*b*) of the second exhaust pipe (62, 62*a*, 62*b*) at a position overlapping the trajectory TJ.

When the gas flow is not biased to the trajectory TJ of the droplet target, by arranging the second opening 63 in a ring-like shape as shown in FIG. 14, it is possible to cause the gas to flow to the trajectory TJ of the droplet target while maintaining the unbiased state, so that the trajectory TJ is not destabilized.

8. Electronic Device Manufacturing Method

Figure 15:
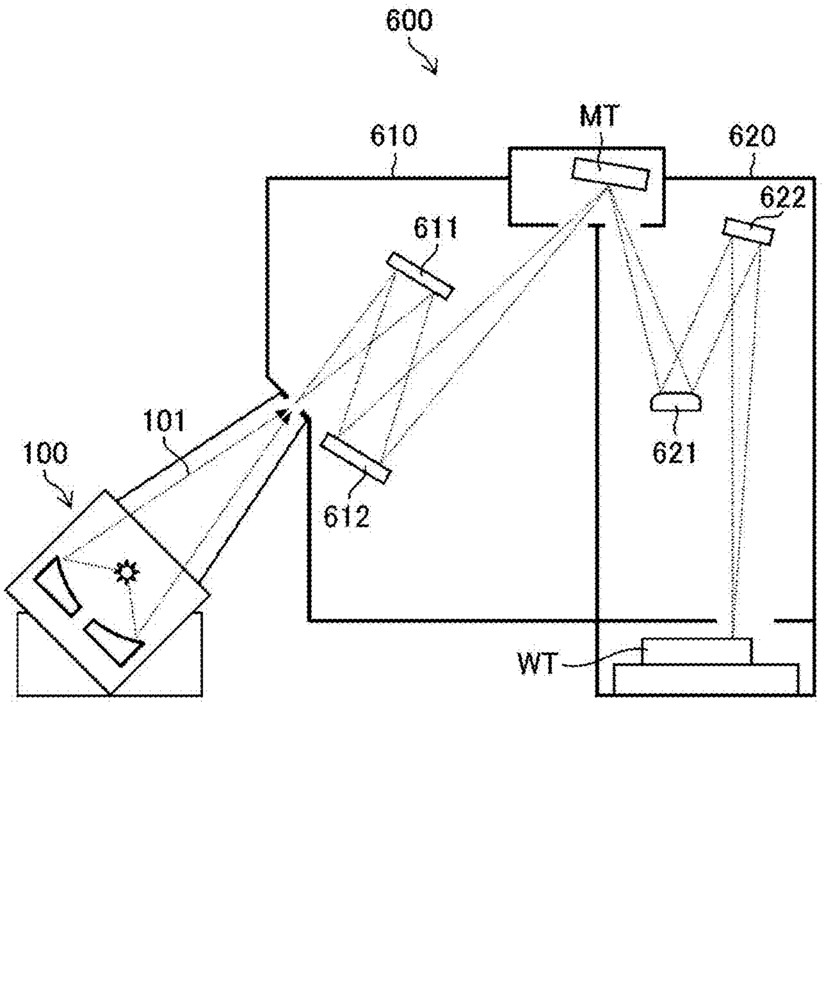
FIG. 15 is a schematic view showing the configuration of an exposure apparatus connected to the EUV light generation apparatus.

FIG. 15 is a schematic view showing a schematic configuration example of an entire electronic device manufacturing apparatus. The electronic device manufacturing apparatus shown in FIG. 15 includes an EUV light generation apparatus 100 and an exposure apparatus 600. The EUV light generation apparatus 100 may be any of the EUV light generation apparatuses 1*c*, 1*d*, le, 1*f*, 1*g* described above. The exposure apparatus 600 includes a mask irradiation unit 610 including a plurality of mirrors 611, 612 that configure a reflection optical system, and a workpiece irradiation unit 620 including a plurality of mirrors 621, 622 that configure a reflection optical system different from the reflection optical system of the mask irradiation unit 610. The mask irradiation unit 610 illuminates, via the mirrors 611, 612, a mask pattern of a mask table MT with EUV light 101 incident from the EUV light generation apparatus 100. The workpiece irradiation unit 620 images the EUV light 101 reflected by the mask table MT onto a workpiece (not shown) arranged on a workpiece table WT via the mirrors 621, 622.

The workpiece is a photosensitive substrate such as a semiconductor wafer on which photoresist is applied. The exposure apparatus 600 synchronously translates the mask table MT and the workpiece table WT to expose the workpiece to the EUV light 101 reflecting the mask pattern. Through the exposure process as described above, a device pattern is transferred onto the semiconductor wafer, whereby a semiconductor device can be manufactured.

Figure 16:
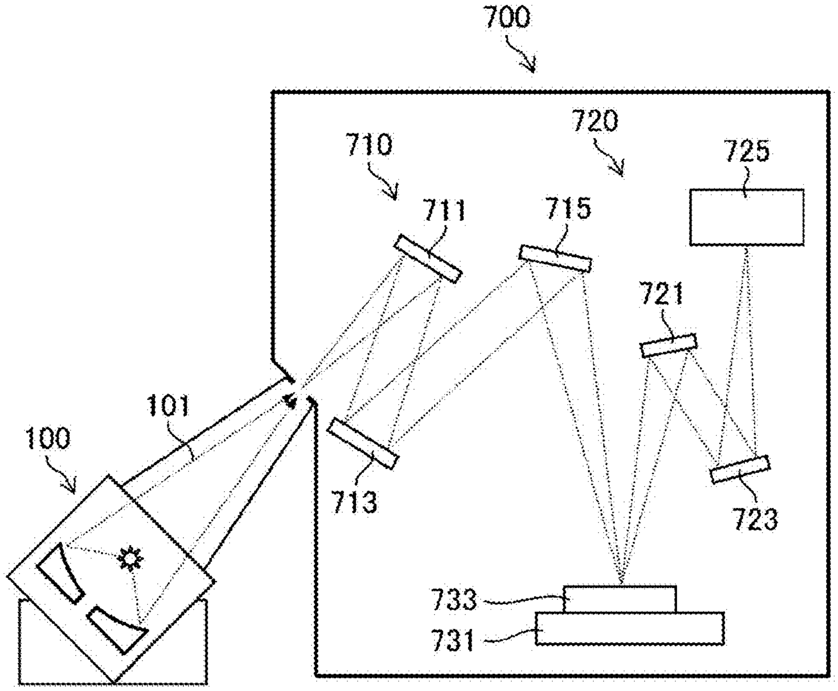
FIG. 16 is a schematic view showing the configuration of an inspection apparatus connected to the EUV light generation apparatus.

FIG. 16 is a schematic view showing a schematic configuration example of an entire electronic device manufacturing apparatus different from the electronic device manufacturing apparatus shown in FIG. 15. The electronic device manufacturing apparatus shown in FIG. 16 includes the EUV light generation apparatus 100 and an inspection apparatus 700. The inspection apparatus 700 includes an illumination optical system 710 including a plurality of mirrors 711, 713, 715 that configure a reflection optical system, and a detection optical system 720 including a detector 725 and a plurality of mirrors 721, 723 that configure a reflection optical system different from the reflection optical system of the illumination optical system 710.

The illumination optical system 710 reflects, with the mirrors 711, 713, 715, the EUV light 101 incident from the EUV light generation apparatus 100 to illuminate a mask 733 placed on a mask stage 731. The mask 733 includes a mask blanks before a pattern is formed. The detection optical system 720 reflects, with the mirrors 721, 723, the EUV light 101 reflecting the pattern from the mask 733 and forms an image on a light receiving surface of the detector 725. The detector 725 having received the EUV light 101 acquires an image of the mask 733. The detector 725 is, for example, a time delay integration (TDI) camera. A defect of the mask 733 is inspected based on the image of the mask 733 acquired by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 600.

9. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A chamber in which a target is turned into plasma to generate extreme ultraviolet light at a plasma generation region by the target being irradiated with laser light, the chamber comprising:

a gas supply port through which a gas is supplied into the chamber;

a light concentrating mirror configured to concentrate the extreme ultraviolet light;

a first exhaust pipe arranged in the chamber, surrounding the plasma generation region, and including a first opening through which the gas supplied into the chamber is sucked and through which the extreme ultraviolet light is radiated toward the light concentrating mirror, and a first exhaust port through which the gas sucked through the first opening is exhausted to an outside of the chamber; and a second exhaust pipe arranged in the chamber, and including a second opening which is located in a periphery of the first opening and through which the gas supplied into the chamber is sucked, and a second exhaust port through which the gas sucked through the second opening is exhausted to the outside of the chamber, wherein the plasma generation region is located in a space at an inside of the first exhaust pipe.

2. The chamber according to claim 1, wherein the second opening is arranged as facing toward a radiation region of the extreme ultraviolet light traveling from the plasma generation region toward a reflection surface of the light concentrating mirror.

3. The chamber according to claim 2, wherein the second opening is arranged on a side toward an end of the first opening from a reflection point, of the reflection surface of the light concentrating mirror, closest to the plasma generation region.

4. The chamber according to claim 1, wherein the gas is a hydrogen gas.

5. The chamber according to claim 1, wherein a plurality of the second exhaust pipes are arranged.

6. The chamber according to claim 1, wherein the second opening is arranged at a position overlapping a trajectory of the target when viewing the first opening and the second opening from the light concentrating mirror.

7. The chamber according to claim 1, wherein the second exhaust pipe covers the first exhaust pipe over an entire length thereof.

8. The chamber according to claim 1, wherein the periphery of the first opening is a region in the chamber, excluding a first region through which the extreme ultraviolet light traveling toward the light concentrating mirror from the first opening passes and a second region through which the extreme ultraviolet light reflected by the light concentrating mirror passes, on a side toward the plasma generation region from a reflection point, of a reflection surface of the light concentrating mirror, closest to the plasma generation region.

9. An extreme ultraviolet light generation system comprising:

a chamber in which a target is turned into plasma to generate extreme ultraviolet light at a plasma generation region by the target being irradiated with laser light, the chamber including:

a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber;

a target supply unit configured to generate a droplet being the target and supply the droplet to the plasma generation region;

a laser light generation unit configured to generate the laser light; and an exhaust device configured to exhaust the gas through the first exhaust port and the second exhaust port, wherein the plasma generation region is located in a space at an inside of the first exhaust pipe.

10. The extreme ultraviolet light generation system according to claim 9, further comprising a processor configured to control an exhaust amount of the gas.

11. The extreme ultraviolet light generation system according to claim 10, wherein the processor controls a pump of the exhaust device.

12. The extreme ultraviolet light generation system according to claim 11, further comprising a valve configured to adjust the exhaust amount, wherein the processor controls the valve.

13. The extreme ultraviolet light generation system according to claim 12, wherein the processor controls at least one of the pump and the valve with a total amount of the exhaust amount kept constant.

14. The extreme ultraviolet light generation system according to claim 9, wherein a plurality of the exhaust devices are arranged.

15. The extreme ultraviolet light generation system according to claim 9, wherein the exhaust device includes a first exhaust device connected to the first exhaust pipe, and a second exhaust device connected to the second exhaust pipe.

16. The extreme ultraviolet light generation system according to claim 15, wherein a plurality of the second exhaust pipes are arranged, and each of the second exhaust pipes includes a valve configured to adjust an exhaust amount of the gas.

17. The extreme ultraviolet light generation system according to claim 9, wherein the periphery of the first opening is a region in the chamber, excluding a first region through which the extreme ultraviolet light traveling toward the light concentrating mirror from the first opening passes and a second region through which the extreme ultraviolet light reflected by the light concentrating mirror passes, on a side toward the plasma generation region from a reflection point, of a reflection surface of the light concentrating mirror, closest to the plasma generation region.

18. An electronic device manufacturing method, comprising:

generating extreme ultraviolet light using an extreme ultraviolet light generation system;

outputting the extreme ultraviolet light to an exposure apparatus; and exposing a photosensitive substrate to the extreme ultraviolet light in the exposure apparatus to manufacture an electronic device, the extreme ultraviolet light generation system including:

a chamber in which a target is turned into plasma to generate the extreme ultraviolet light at a plasma generation region by the target being irradiated with laser light, the chamber including:

a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber;

a target supply unit configured to supply a droplet being the target to the plasma generation region;

a laser light generation unit configured to generate the laser light; and an exhaust device configured to exhaust the gas through the first exhaust port and the second exhaust port, wherein the plasma generation region is located in a space at an inside of the first exhaust pipe.

19. An electronic device manufacturing method, comprising:

inspecting a defect of a mask by irradiating the mask with extreme ultraviolet light generated by an extreme ultraviolet light generation system;

selecting a mask using a result of the inspection; and exposing and transferring a pattern formed on the selected mask onto a photosensitive substrate, the extreme ultraviolet light generation system including:

a chamber in which a target is turned into plasma to generate the extreme ultraviolet light at a plasma generation region by the target being irradiated with laser light, the chamber including:

a gas supply port through which a gas is supplied into the chamber, a light concentrating mirror configured to concentrate the extreme ultraviolet light, a first exhaust pipe arranged in the chamber, surrounding the plasma generation region, and including a first opening through which the gas supplied into the chamber is sucked and through which the extreme ultraviolet light is radiated toward the light concentrating mirror and a first exhaust port through which the gas sucked through the first opening is exhausted to an outside of the chamber, and a second exhaust pipe arranged in the chamber, and including a second opening which is located in a periphery of the first opening and through which the gas supplied into the chamber is sucked and a second exhaust port through which the gas sucked through the second opening is exhausted to the outside of the chamber;

a target supply unit configured to supply a droplet being the target to the plasma generation region;

a laser light generation unit configured to generate the laser light; and an exhaust device configured to exhaust the gas through the first exhaust port and the second exhaust port, wherein the plasma generation region is located in a space at an inside of the first exhaust pipe.

* * * * *